United States Patent [19]

Bagchi

[11] Patent Number: 5,252,425
[45] Date of Patent: Oct. 12, 1993

[54] HARD COPY IMAGING SYSTEM
[75] Inventor: Pranab Bagchi, Webster, N.Y.
[73] Assignee: Eastman Kodak Company, Rochester, N.Y.
[21] Appl. No.: 746,544
[22] Filed: Aug. 19, 1991
[51] Int. Cl.$^5$ ............................ G03C 5/54; G03C 1/68
[52] U.S. Cl. ................................. 430/201; 430/203; 430/271; 430/952
[58] Field of Search ................ 430/201, 271, 203, 952

[56] References Cited

U.S. PATENT DOCUMENTS

| | | | |
|---|---|---|---|
| 4,006,018 | 2/1977 | Wiese | 430/201 |
| 4,576,891 | 3/1986 | Adiar et al. | 430/138 |
| 4,587,198 | 5/1986 | Fisch | 430/201 |
| 4,621,271 | 11/1986 | Brownstein | 346/76 |
| 4,764,444 | 8/1988 | Simons et al. | 430/201 |
| 4,775,657 | 10/1988 | Harrison et al. | 503/227 |
| 4,883,124 | 5/1989 | Lum | 503/227 |
| 4,927,803 | 5/1990 | Bailey et al. | 503/227 |
| 5,021,321 | 6/1991 | Fukui et al. | 430/201 |

FOREIGN PATENT DOCUMENTS

| | | | |
|---|---|---|---|
| 362827 | 4/1990 | European Pat. Off. | 430/201 |
| 59-55429 | 3/1984 | Japan . | |

*Primary Examiner*—Richard L. Schilling
*Attorney, Agent, or Firm*—Robert A. Gerlach

[57] ABSTRACT

This invention relates to a full-color hard copy imaging system and a process, where a multiply photosensitive donor sheet, comprising clear polymeric or an opaque paper base, coated sequentially with a first layer of patches of a cyan, a magenta, and a yellow dye, that are thermally diffusible, with a second layer also coated sequentially with patches of a red light sensitive, a green light sensitive or a blue light sensitive, negative or a positive working photoresist layer, in such a manner that each of the colored dye patches are in registry with their complementary color sensitive photoresist patches, is exposed with white light sequentially, three times in registry on the three primary light sensitive patches, through a multicolor image (a positive transparency or a photographic negative), to produce crosslinks, image wise, in the exposed areas in the case of the negative resist system, or to uncrosslink the resist structure image wise in the exposed areas for a positive working resist system. In the second step, the first color patch is laminated on to a receiver sheet that is composed of a clear plastic layer in which the chromogenic dyes are soluble, with or without a white reflective backing and the first color image is transferred to the receiver sheet by thermal evaporation. The image is formed due to the hindrance of diffusion of dye in the crosslinked regions of the resist layer in the donor sheet. In subsequent consecutive steps the two remaining color images are transferred, by similar thermal process in registry on to the receiver sheet, thereby forming a full-color image of the original image.

10 Claims, 2 Drawing Sheets

HARD COPY IMAGING SYSTEM

BACKGROUND OF THE INVENTION

1. Field of the Invention

This invention relates to a full-color hard copy imaging system and an imaging process, to achieve a full color image.

2. Description of Related Art

Many ways of creation of a full-color hard copy image by thermal transfer of dyes on to a receiver sheet are well known. One system described in U.S. Pat. No. 4,833,124; 4,927,803; and U.S. Pat. No. 4,775,657 obtains prints from pictures which have been generated electronically from a color video camera. According to one way of obtaining such prints, an electronic picture is first subjected to color separation by color filters. The respective color-separate images are then converted into electrical signals. These signals are then operated on to produce cyan, magenta and yellow electrical signals. These signals are then transmitted to a thermal printer. To obtain the print, a cyan magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271 by Brownstein entitled "Apparatus and Method For Controlling A Thermal Printer Apparatus", issued Nov. 4, 1986.

A second system described in U.S. Pat. No. 4,587,198 sets forth a process for providing a colored image comprising exposing a radiation sensitive layer over a vapor deposited colorant layer and vaporizing the colorant to selectively transmit the colorant through the exposed layer. The change in solubility, penetrability and/or crosslinking polymerization causes differential migration through the exposed layer.

Japanese Kokai 69-55429; 1982 discloses a method of forming color images by thermal development, by processing a silver salt light sensitive material containing dye by thermal development, thereby conducting tanning developing, imagewise hardening a silver salt light sensitive material binder, suppressing diffusion of said dyes from the binder to an image receiving layer and imagewise forming color images to the image receiving layer.

A full-color hard copy imaging system is shown in U.S. Pat. No. 4,576,891 in which the donor sheet is coated with three types of microencapules. The first type of microencapules comprise a cyan dye-former and a photocrosslinkable composition that crosslinks upon exposure to red light, the second type of microencapsules comprise a magenta dye-former and a photocrosslinkable composition that crosslinks upon exposure to green light and a third type of microencapsules comprise a yellow dye-former and a photocrosslinkable composition that crosslinks upon exposure to blue light. The donor sheet is exposed with a multicolor positive image and then laminated to a receiver sheet through a hot pressure roller. The receiver sheet is coated with a layer containing a universal development agent for the three dye formers. Under pressure and heat the uncrosslinked capsules rupture and the dye-formers of all the three colors are transferred to this receiver sheet, when they imagewise form three color dyes producing a full-color image. The major advantage of this system is that a full-three color image is formed in a single lamination and pressure development step However, the disadvantages associated with the process is that the microencapsules are in a range of diameters between 1 to 25 microns. Therefore, the resolution of the system is limited to size of the largest microencapsules.

SUMMARY OF THE INVENTION

An object of this invention is to provide a hard copy imaging system with resolution limited by the resolution of the exposing optical system.

Another object of this invention is to provide a hard copy imaging system where the imaging process is controlled by fast light exposures and simple heat development rather than slow pixel-wise heat exposure, which for very high resolution images are extremely time consuming for the need of high volume consumer products.

Another object of this invention is to provide a simple, inexpensive processing system and device for producing hard copy images from positive color transparencies or from a negative photographic image.

This invention provides a full-color hard copy imaging system and a process, employing a bilayer multiply photosensitive donor sheet comprising a clear polymeric or an opaque paper-like base coated sequentially with a fist layer of patches or discrete areas of a cyan dye, a magenta dye, and a yellow dye, that are thermally diffusible, and a second layer also coated sequentially with patches or discrete areas of a red light sensitive photoresist material, a green light sensitive photoresist material and a blue light sensitive photoresist material, each photoresist material may be negative or positive working. The two layers are coated in such a manner that each of the colored dye areas are in registry with their complementary color sensitive photoresist areas exposing with white light sequentially, three times in registry on the three primary light sensitive areas, through a multicolor image transparency which may be a positive transparency or a photographic negative, to produce crosslinks image wise, in the exposed areas in the case of the negative resist system, or to uncrosslink the resist structure image wise in the exposed areas for a positive working resist system. In the second step, the first color path is laminated on to a receiver sheet that is composed of a clear plastic layer in which the chromogenic dyes are soluble, with or without a white reflective backing and the first color image is transferred to the receiver sheet by thermal evaporation. The image is formed due to the hindrance of diffusion of dye in the crosslinked regions of the resist layer in the donor sheet. In subsequent consecutive steps the two remaining color images are transferred, by similar thermal process in registry on to the receiver sheet, thereby forming a full-color image of the original image. It is to be noted that, in case where negative working resists are employed a positive image is obtained, such as a positive print from a transparency and a negative image is obtained in case where a positive working resist is employed, such as obtaining a positive print of a negative. In the case of systems with positive working resist materials, it is necessary to etch away the uncrosslinked areas before thermal transfer of the dyes.

In an alternate embodiment of this invention, the dyes in the donor sheet are replaced with a dye-precursors and the clear polymer layer of the receiver sheet is impregnated with one to three developing agents, in which case, the image is formed by the reaction of the dye precursors, after thermal transfer, with an universal or three specific dye-developing agents.

DETAILED DESCRIPTION OF THE INVENTION

Figure 1:
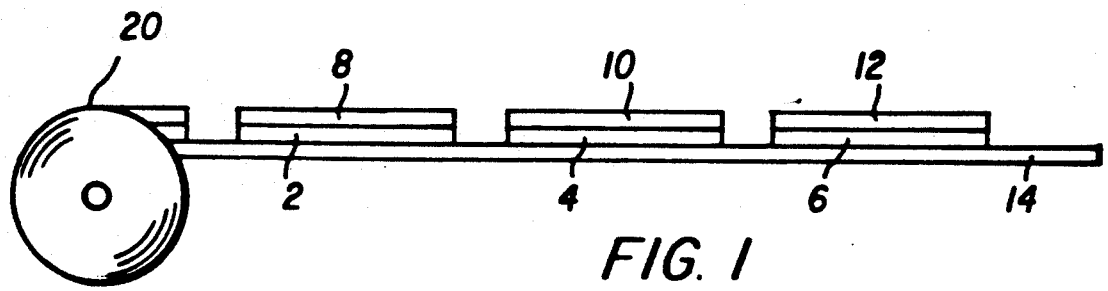
FIG. 1 is a cross-section of a bilayer actinically sensitive imaging donor sheet in accordance with this invention.

This invention is illustrated in conjunction with the drawings in which like reference characters illustrate like parts. FIG. 1 shows a donor sheet 20 in roll form having a support 14 containing a first layer of patches or discrete areas of three different color dyes, 2, 4, and 6. Areas 2 are cyan colored dyes, areas 4 are magenta and areas 6 are yellow. Over the first layer is deposited a second layer comprising patches or discrete areas of color sensitive photoresist patches or discrete areas 8, 10 and 12. Each color sensitive photoresist patch or area is coextensive and in registry with the dye path in the first layer and is sensitive to light of a color complementary to that of the dye patch immediately below it. Thus, resist patch 8 is sensitive to red light which is complementary to cyan dye patch 2; resist patch 10 is sensitive to green light which is complementary to magenta dye patch 4 and resist patch 12 is sensitive to blue light which is complementary to yellow dye patch 6. By "sensitive" is meant that the material of the patches 8, 10 or 12 will either crosslink or uncrosslink when exposed to light of the color, to which the patch is sensitive depending upon whether it is a negative working resist or a positive working resist, respectively, as the case may be.

FIG. 2 illustrates the steps of the imaging method necessary to obtain a single color positive employing a negative working photoresist sensitive to light of one of the three primary colors red, green or blue. For the purpose of clarity in understanding the invention, the dye patch 2 shown is cyan and the photoresist 8, the red sensitive patch will be referred to throughout this discussion, however, the other two dye/resist pairs shown in FIG. 1 can be inserted here in the description to serve as the illustration. In fact, the imaging method in accordance with this invention requires that the imaging process be repeated with each of the dye/resist pairs of FIG. 1 to obtain a copy of the original.

Figures 2A, 2B, 2C:
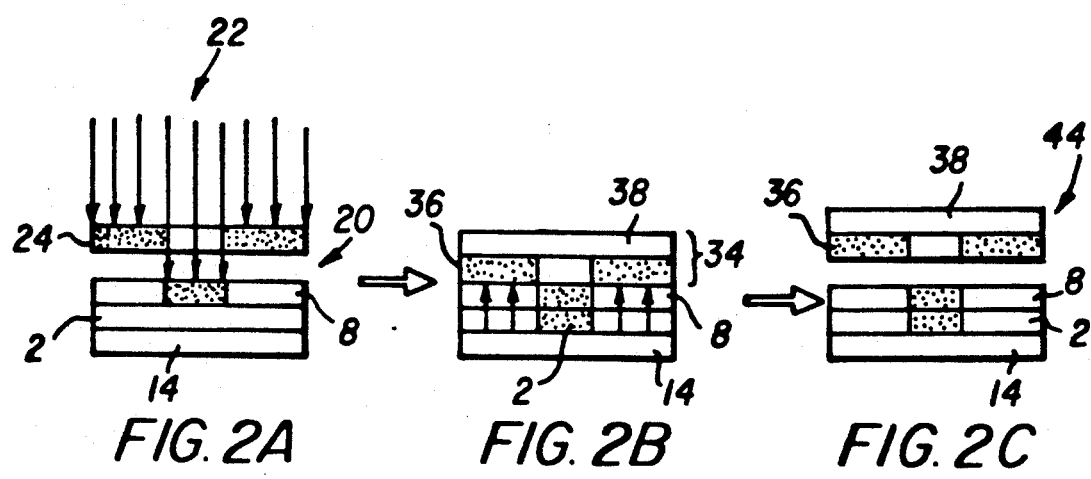
FIG. 2a, 2b and 2c are diagrammatic views showing the steps of the inventive process for one of the three primary colors.
Figure 3:
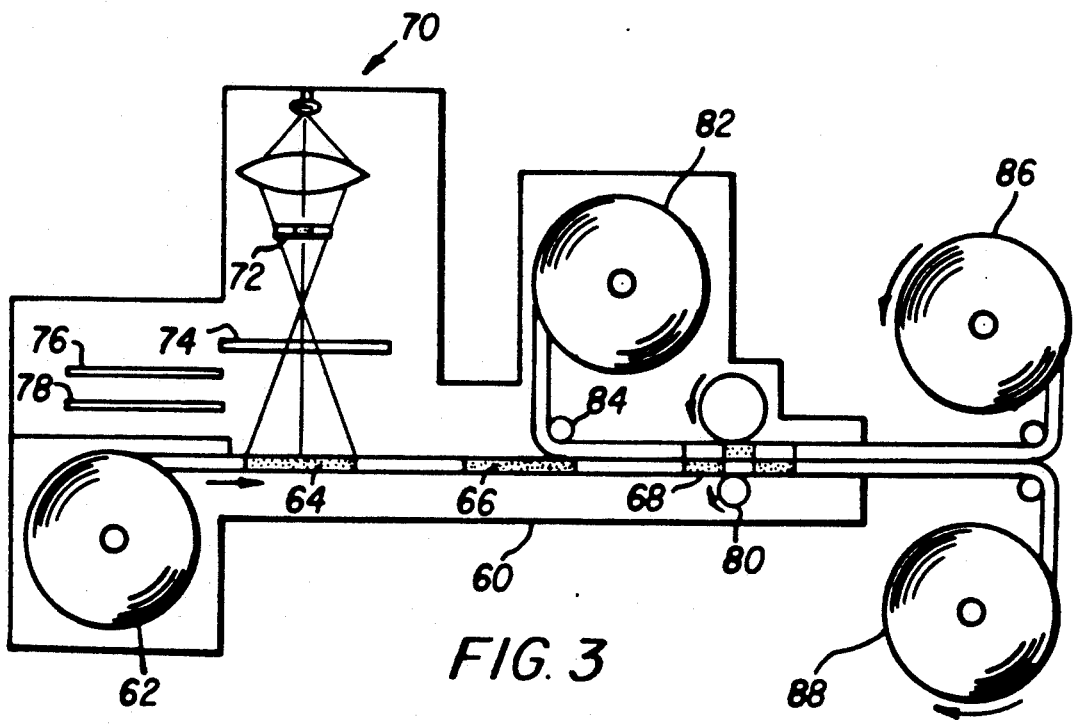
FIG. 3 is a schematic view of a full-color imaging system in accordance with the invention.

FIG. 2a shows that portion of the donor sheet comprising substrate 14 having the cyan dye patch 2 overcoated with the red sensitive photoresist patch 8 in a position for exposure more clearly illustrated in FIG. 3. It is to be understood that the portion of the donor sheet 20 shown is a part of the overall donor sheet which includes, in addition to that shown in FIG. 2a., the magenta dye layer 4/green sensitive photoresist 10 pair plus the yellow dye layer 6/blue photosensitive layer 12 pair. As shown in FIG. 2a the donor layer is exposed to white light 22 through a mask 24, which may be a positive transparency, a photographic negative or a positive or negative computer generated transparency such as, a liquid crystal image as the case may be, causing the crosslinking of the photoresist layer 8 in the regions where the light impinges on the photoresist layer 8 (in the embodiment shown, the resist layer 8 is a negative working resist). In the next step, the donor sheet comprising the substrate 14, the cyan dye layer 2 and the photoresist layer 8 are laminated together with a receiving sheet 34 which comprises a layer 36 in which the chromogenic dyes are soluble and optionally a white reflecting backing layer 38. The red dye from the dye layer 2 is transferred to the receiving layer 36 in all places except where photoresist layer 8 has been caused to crosslink due to the impingement of light thereon as shown in FIG. 2a. This transfer of dye is caused by a thermal heating step more particularly illustrated hereinafter in reference to FIG. 3. Finally, as shown in FIG. 2c, the receiving layer is separated from the donor layer to produce a positive red image 44 of the original.

The entire imaging process of this invention is illustrated schematically in FIG. 3. The imaging device is enclosed in a light-tight enclosure 60. The photosensitive imaging bilayer dye donor sheet coated in patches of red, green, and blue sensitive layers is rolled up in roll 62. The structure of the invention donor sheet is shown in FIG. 1. Each photosensitive resist patch/dye donor patch pair (64, red; 66, green; and 68, blue) passes under an exposing condenser system 70, and is exposed by a suitable white light source through a test transparency 72, while the donor layer is held in position. The blue sensitive/yellow dye pair 68 is shown at the thermal imaging transfer station 80, while the green sensitive/magenta pair 66 approaches station 80 and red sensitive/cyan dye pair 64 is in the exposure station. During exposure color correction filters 74 (red), 76 (green), 78 (blue) may be applied to correct for slight miss match of action spectra of the sensitive layer and the desired color balancing action spectra of the various photosensitive patches. Thus, by these exposures, the red, green and blue images are generated in registry in the sequential patch coated donor sheet. The receiver sheet roll 82 provides the image forming dye-receiving sheet. The dye-receiving element is laminated facing the dye donor sheet in station 84. Each colored dye donor element is then heated to up to 150° C. at the thermal imaging transfer station 80 comprising a pinch roller heating system, in registry to evaporate the yellow, magenta and cyan dyes to the receiver sheet for form a full color positive image of the transparency 72. The formed positive image, by this mechanism of FIG. 2 is taken up in receiving roller 86 for distribution to the customer and the spent donor sheet is rolled up in roller 88 to be returned for recovery of the unused dyes from the donor sheet. FIG. 3 represents a schematic of the concept of image formation by the use of the imaging bilayer sheet of FIG. 1 and process of FIG. 2.

Figure 4:
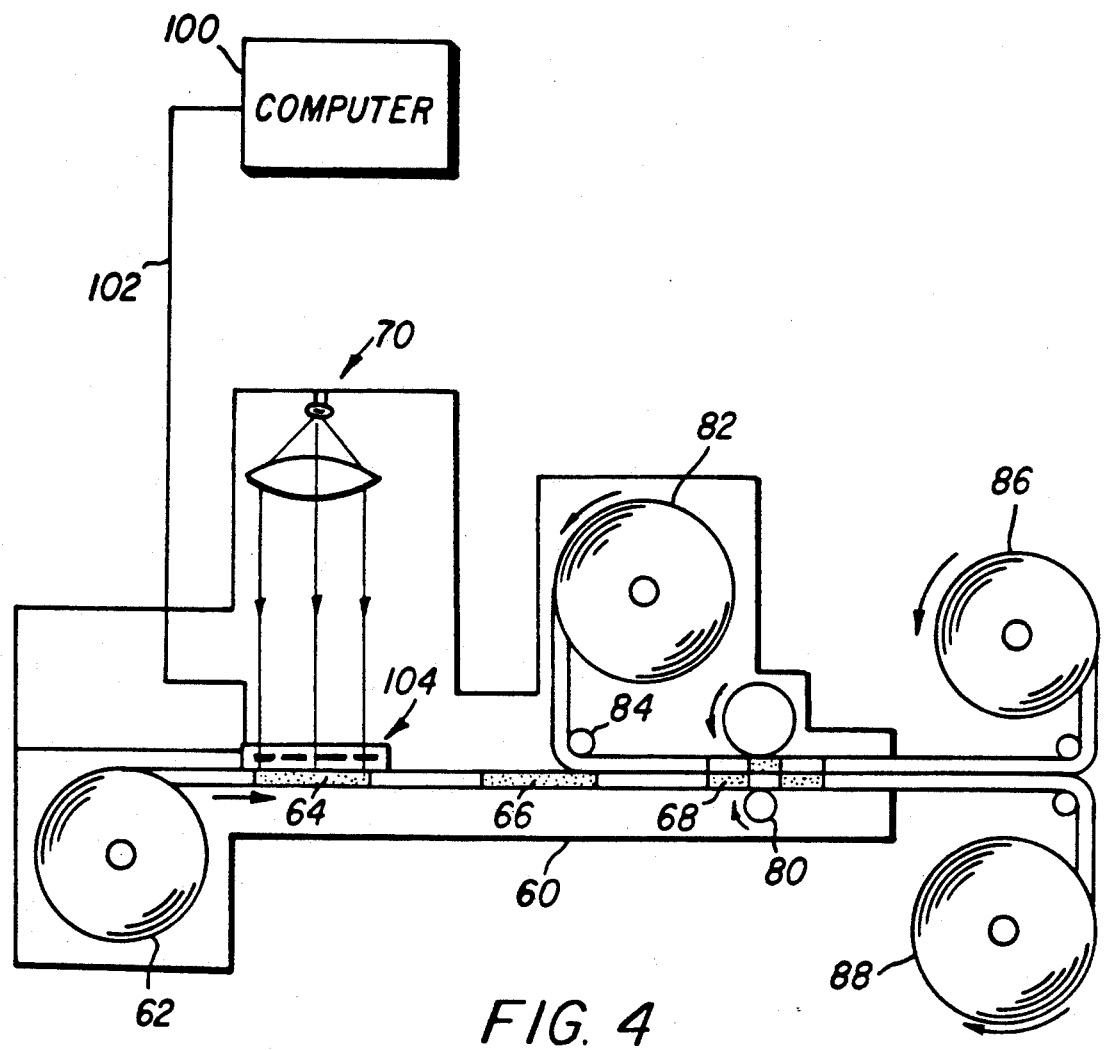
FIG. 4 is a schematic view of a second embodiment in accordance with this invention.

In an alternate embodiment of this invention shown in FIG. 4, neutral color separation images can be formed by a computer 100 from a full color scanned image data stored in the various storage media of a computer and the digital information transmitted through a proper interface line 102 to a liquid crystal imager 104 placed in the exposure station of the imaging device described in FIG. 3. Exposure is carried out by light through the liquid crystal image to the appropriate photosensitive element of the imaging donor sheet of this invention and through color image formed by consecutive exposure of the three color patches with their appropriate three color separation images generated sequentially by the computer. The major advantage of such a system is that electronic digital information is transmitted to a photosensitive layer element all at once for each color record and not pixel wise. This translates to faster time for the whole imaging process compared to forming the image by transmitting information pixel at a time. Shorter time for image formation is particularly advantageous for the high volume consumer market.

In place of the liquid crystal imager, the three primary color light sensitive imaging element can be addressed by means of three scanning lasers, each of which emits light of one of the three primary colors to expose the imaging element sensitive to that color.

The support of the actinically sensitive imaging layer can be any kind of base to which heat can be applied to cause thermal transfer of the image dye under pressure through a device such as a hot pinch roller. In the preferred embodiment the base of the dye donor element comprises a poly(ethylene terephthalate).

A dye-donor element (FIG. 1) that is used with the dye-receiving element employed in the invention comprises a support having thereon a dye layer. Any dye can be used in such a layer provided it is transferable to the dye image-receiving layer of the dye-receiving element of the invention by the action of heat. Especially good results have been obtained with sublimable dyes. Examples of sublimable dyes include anthraquinone dyes, e.g., Sumikalon Violet RS®️ (product of Sumitomo Chemical Co., Ltd.), Dianix Fast Violet 3R-RF®️ (product of Mitsubishi Chemical Industries, Ltd.), and Kayalon Polyol Brilliant Blue N-BGM®️ and KST Black 146®️ (products of Nippon Kayaku Co., Ltd.), azo dyes such as Kayalon Polyol Brilliant Blue BM®️, Kayalon Polyol Dark Blue 2BM®️, and KST Black KR®️ (products of Nippon Kayaku Co., Ltd.), Sumickaron Diazo Black 5G®️ (product of Sumitomo Chemical Co., Ltd.), and Miktazol Black 5GH®️ (product of Mitsui Toatsu Chemicals, Inc.); direct dyes such as Direct Dark Green B®️ (product of Mitsubishi Chemical Industries, Ltd.) and Direct Brown M®️ and Direct Fast Black D®️ (products of Nippon Kayaku Co., Ltd.) acid dyes such as Kayanol Milling Cyanine 5R®️ (product of Nippon Kayaku Co. Ltd.); basic dyes such as Sumicacryl Blue 6G®️ (product of Sumitomo Chemical Co., Ltd.), and Aizen Malachite Green®️ (product of Hodogaya Chemical Co., Ltd.);

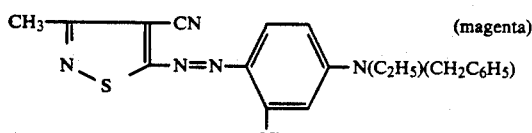

(magenta)

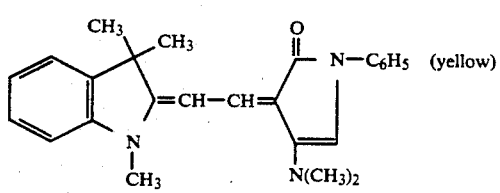

(yellow)

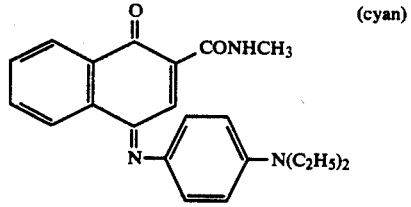

(cyan)

or any of the dyes disclosed in U.S. Pat. No. 4,541,830, the disclosure of which is hereby incorporated by reference. The above dyes may be employed singly or in combination to obtain a monochrome. The dyes may be used at a coverage of from about 0.05 to about 1 g/m$^2$ and are preferably hydrophobic.

A black-and-white or neutral-hue dye image could also be obtained using the invention by employing mixtures of cyan, magenta and yellow dyes, using a neutral-hue dye, or by using the process described above repeatedly for each color without differentiating the color record being printed.

The dye in the dye-donor element is dispersed in a polymeric binder such as a cellulose derivative, e.g., cellulose acetate hydrogen phthalate cellulose acetate, cellulose acetate propionate, cellulose acetate butyrate, cellulose triacetate; polycarbonate; poly(styrene-co-acrylonitrile), poly(sulfone) or poly(phenylene oxide). The binder may be used at a coverage of from about 0.1 to about 5 g/m$^2$.

The dye layer of the dye-donor element may be coated on the support or printed thereon by a printing technique such as a gravure process.

Any material can be used as the support for the dye-donor element provided it is dimensionally stable and can withstand the heat of the thermal printing heads. Such materials include polyesters such as poly(ethylene terephthalate); polyamides; polycarbonates; glassine paper; condenser paper; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylpentane polymers; and polyimides such as polyimide-amides and polyether-imides. The support generally has a thickness of from about 2 to about 30 um. It may also be coated with a subbing layer, if desired.

A dye-barrier layer comprising a hydrophilic polymer may also be employed in the dye-donor element between its support and the dye layer which provides improved dye transfer densities. Such dye-barrier layer materials include those descried and claimed in U.S. Pat. No. 4,700,208 of Vanier et al issued Oct. 13, 1987.

The reverse side of the dye-donor element may be coated with a slipping layer to prevent the printing head from sticking to the dye-donor element. Such a slipping layer would comprise a lubricating material such as a surface active agent, a liquid lubricant, a solid lubricant or mixtures thereof, with or without a polymeric binder. Preferred lubricating materials include oils or semi-crystalline organic solids that melt below 100° C. such as poly(vinyl stearate), beeswax, perfluorinated alkyl ester polyethers, phosphoric acid esters, silicone oils, poly(caprolactone), carbowax or poly(ethylene glycols). Suitable polymer binders for the slipping layer include poly(vinyl alcohol-co-butyral), poly(vinyl alcohol-co-acetal), poly(styrene), poly(styrene-co-acrylonitrile), poly(vinyl acetate), cellulose acetate butyrate, cellulose acetate or ethyl cellulose.

The amount of the lubricating material to be used in the slipping layer depends largely on the type of lubricating material, but is generally in the range of about 0.001 to about 2 g/m². If a polymeric binder is employed, the lubricating material is present in the range of 0.1 to 50 weight percent, preferably 0.5 to 40, of the polymeric binder employed.

The dye-donor element employed in certain embodiments of the invention may be used in sheet form or in a continuous roll or ribbon. If a continuous roll or ribbon is employed, it may have only one dye thereon or may have alternating areas of different dyes such as cyan, magenta, yellow, black, etc., as disclosed in U.S. Pat. No. 4,541,830.

In a preferred embodiment of the invention, a dye-donor element is employed which comprises a poly(ethylene terephthalate) support coated with sequential repeating areas of cyan, magenta and yellow dye, and the above process steps are sequentially performed for each color at least two times to obtain a three-color dye transfer image. Of course, when the process is only performed for a single color, then a monochrome dye transfer image is obtained. The dye patches may be coated by a gravure coating technique on a suitable coating methods.

As indicated in FIG. 1, the most preferred embodiment of this invention constitutes a coated layer of actinically activated photoresist layer on the dye patches of the donor sheet these layers may be coated in the same manner as indicated earlier. The preferred configuration is that the cyan dye-patch is over coated with a red light sensitive resist material, the magenta dye patch is over coated with a green light sensitive resist patch and the yellow dye patch is over coated with a blue light sensitive resist patch. If the dye layer is of neutral color, compound of a single dye or comprising a mixture of dyes, then the resist layer is sensitive to all red, green and blue radiations.

Formulation of photoresist compositions that are sensitive to red, green or blue radiations are described in U.S. Pat. No. 4,713,312; U.S. Pat. No. 4,576,891; U.S. Pat. No. 4,772,530 and U.S. Pat. No. 4,772,541. In the preferred embodiment the resist layers are negative working comprising a photohardenable composition comprising a free radical addition polymerizable or crosslinkable compound and a photosensitive compound capable of generating radicals upon exposure with actinic radiation of desired wavelengths and induce crosslinking of the crosslinkable compound.

A class of such radical generating actinic materials comprise dye borate complexes.

It has been found that cationic dye-borate anion complexes are useful photoinitiators of free radical addition reactions. The mechanism whereby the complexes absorb energy and generate free radicals is not entirely clear, however, cyanine and similar dyes which are useful in the complex, are known to form little or no triplet state. It is, therefore, believed that upon exposure to actinic radiation, the dye in the complex is excited to a singlet state in which it accepts an electron from the borate anion as follows:

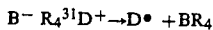
B⁻ R₄³¹D⁺→D• +BR₄ (Eq. 1)

The lifetime of the dye singlet state is extremely short by comparison to the lifetime of the triplet state of a conventional photoinitiator indicating that the complex provides a very efficient electron transfer. In solution in the polymerizable compound, ionic pairing of the borate anion and the cationic dye is believed to provide favorable spatial distribution for promoting electron transfer to such an extent that the transfer occurs even though the lifetime of the single state is very short. After electron transfer, the borate anion reacts by a mechanism which is not clear to form a radical which initiates free radical addition polymerization or crosslinking of the polymerizable or crosslinkable species in the photohardenable composition (see Equation 2 below).

In most prior dye-sensitized systems, random collisions of the dye and the corresponding activator (i.e., oxidizing or reducing agent) are relied upon to effect the electron transfer. In some cases these collisions produce a complex also known as an exciplex. The complex is a transient entity and its formation and electron transfer are controlled by diffusion. The complexes used in the present invention are pre-formed (not diffusion controlled) and, therefore, provide higher film speeds than have been available in many prior art systems.

Thus, the present invention is believed to provide a means for generating free radicals from the single state of an excited dye and, in so doing, provides photohardenable compositions which are sensitive at longer wavelengths.

One of the particular advantages of using cationic dye-borate anion complexes as initiators of free radical addition reactions is the ability to select from a large number of dyes which absorb at substantially different wavelengths. The absorption characteristics of the complex are principally determined by the dye. Thus by selecting a dye which absorbs at 400 nm or greater, the sensitivity of the photosensitive material can be extended well into the visible range. The cationic dye-borate anion complex sensitized compositions are particularly useful in providing full color photosensitive materials as compositions for layers sensitive to the three primary colors can be formulated.

The term "complex" as used herein refers to complexes of the formula (I) below which may be a simplification of their structure. The term and formula also include complexes in which a cluster of two or more dye cations may be complexed with two or more borate anions.

The term "cationic dye" includes dyes such as cyanine dyes as well as dyes in which a cationic moiety such as a quaternary ammonium ion is covalently linked to an otherwise neutral dye structure by a linking group.

U.S. Pat. Nos. 4,399,209 and 4,440,846 are incorporated herein by reference to the extent that reference thereto may be necessary to complete this disclosure.

Cationic dye-borate anion complexes are known in the art. Their preparation and use in imaging systems is described in U.S. Pat. Nos. 3,567,453; 4,307,182; 4,343,891; 4,447,521; and 4,450,227. The complexes used in the present invention can be represented by the general formula (I):

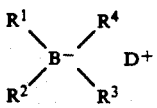

(I)

where $D^+$ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes should not contain groups which would neutralize or desensitize the complex or render the complex poorly dark stable. Examples of groups which generally should not be present in the dye are acid groups such as free carboxylic or sulphonic acid groups.

Specific examples of useful cationic dyes are Methylene Blue, Safranine O Malachite Green, cyanine dyes of the general formula (II) and rhodamine dyes of the formula (III):

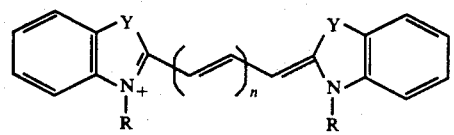

(II)

n=0, 1, 2, 3,
R=alkyl
Y=CH=CH, N—CH$_3$, C(CH$_3$)$_2$, O, S, Se

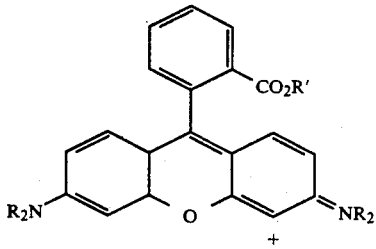

(III)

R', R=alkyl, aryl, and any combination thereof.

While they have not been tested, the cationic cyanine dyes disclosed in U.S. Pat. No. 3,495,987 should be useful in the present invention.

The borate anion is designed such that the borate radical generated upon exposure to light and after electron transfer to the dye (Eq. 1) readily dissociates with the formation of a radical as follows:

(Eq. 2)

For example, particularly preferred anions are triphenylbutylborate and trianisylbutylborate anions because they readily dissociate to triphenylborane or trianisylborane and a butyl radical. On the other hand tetrabutylborate anion does not work well presumably because the tetrabutylborate radical is not stable and it readily accepts an electron back from the dye in a back electron transfer and does not dissociates efficiently.

Likewise, tetraphenylborate anion is very poor because the phenyl radical is not easily formed.

Preferably, at least one but one more than three of $R^1$, $R^2$, $R^3$, and $R^4$ is an alkyl group. Each $R^1$, $R^2$, $R^3$, and $R^4$ can contain up to 20 carbon atoms, and they typically contain 1 to 7 carbon atoms. More preferably $R^1$-$R^4$ are a combination of alkyl group(s) and aryl group(s) or aralkyl group(s) and still more preferably a combination of three aryl groups and one alkyl group.

Representative examples of alkyl groups represented by $R^1$-$R^4$ are methyl, ethyl, propyl, butyl, pentyl, hexyl, octyl, stearyl, etc. The alkyl groups may be substituted, for example, by one or more halogen, cyano, acyloxy, acyl, alkoxy or hydroxy groups.

Representative examples of aryl groups represented by $R^1$-$R^4$ include phenyl, maphthyl and substituted aryl groups such as anisyl and alkaryl such as methylphenyl, dimethylphenyl, etc. Representative examples of aralkyl groups represented by $R^1$-$R^4$ groups include benzyl. Representative alicyclic groups include cyclobutyl, cyclopentyl, and cyclohexyl groups. Examples of an alkynyl group are propynyl and ethynyl, and examples of alkenyl groups include a vinyl group.

As a general rule, useful cationic dye-borate anion complexes must be identified empirically, however, potentially useful cationic dye and borate anion combinations can be identified by reference to the Weller equation (Rehm, D. and Weller, A., *Isr J. Chem.* (1970), 8, 259–271) which can be simplified as follows:

$$\Delta G = E_{ox} - E_{red} - E_{h\nu} \tag{Eq. 3}$$

where $\Delta G$ is the change in the Gibbs free energy, $E_{ox}$ is the oxidation potential of the borate anion $BR_4^-$, $E_{red}$ is the reduction potential of the cationic dye, and $E_{h\nu}$ is the energy of light used to excite the dye. Useful complexes will have a negative free energy change. Similarly, the difference between the potential of the borate must be negative for the complex to be dark stable, i.e., $E_{ox} - E_{red} > 0$.

As indicated, Eq. 3 is a simplification and it does not absolutely predict whether a complex will be useful in the present invention or not. There are a number of other factors which will influence this determination. One such factor is the effect of the monomer on the complex. It is also known that if the Weller equation produces too negative a value, deviations from the equation are possible. Furthermore, the Weller equation only predicts electron transfer, it does not predict whether a particular dye complex is an efficient initiator of polymerization. The equation is useful first approximation.

Specific examples of cationic dye-borate anion complexes useful in the present invention are shown in Table I with their wavelength of maximum absorption, λ-max.

The cationic dye-borate anion complexes can be prepared by reacting a borate salt with a dye in a counter-ion exchange in a known manner. See Hishiki, Y., *Reports. Sci. Research Inst.* (1953), 29, pp 72–79.

Useful borate salts are sodium salts such as sodium tetraphenylborate, sodium triphenylbutylborate, sodium trianisylbutylborate and ammonium salts such as tetraethylammonium tetraphenylborate.

The most typical examples of a free radical addition polymerizable or crosslinkable compound useful in the present invention is an ethylenicaly unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation.

TABLE I
Examples of Cationic Dye-Borate Anion Complexes

| Complex No. | Structure | λ-max (TMPTA) |
|---|---|---|
| 1. | [bis-benzothiazole cyanine with CH$_3$ on central carbon, N-ethyl groups, Ph$_3$B$^-$-n-C$_4$H$_9$] | 552 nm |
| 2. | [bis-benzothiazole trimethine cyanine, N-C$_7$H$_{15}$ groups, Ph$_3$B$^-$-n-C$_4$H$_9$] | 568 nm |
| 3. | [bis-benzoxazole trimethine cyanine, N-n-C$_6$H$_{13}$ groups, Ph$_3$B$^-$-n-C$_4$H$_9$] | 492 nm |
| 4. | [bis-benzothiazole monomethine cyanine, N-CH$_3$ groups, Ph$_3$B$^-$-n-C$_4$H$_9$] | 428 nm |
| 5. | [methylene blue structure with (CH$_3$)N and N(CH$_3$)$_2$, Ph$_3$B$^-$-n-C$_4$H$_9$] | 658 nm |
| 6. | [phenazine dye with CH$_3$, NH$_2$ groups and N-phenyl, Ph$_3$B$^-$-n-C$_4$H$_9$] | 528 nm |
| 7. | [constrained bis-benzothiazole pentamethine cyanine, N-ethyl groups, Ar$_3$B$^-$-R'] | 450 nm |
| 8. | [bis-indoline pentamethine cyanine, N-R groups, Ar$_3$-B$^-$-R'] | 550 nm |
| No. | R' | R | Ar |

TABLE I-continued
Examples of Cationic Dye-Borate Anion Complexes

| | | | |
|---|---|---|---|
| 8A | methyl | n-butyl | phenyl |
| 8B | methyl | n-hexyl | phenyl |
| 8C | n-butyl | n-butyl | phenyl |
| 8D | n-butyl | n-hexyl | phenyl |
| 8E | n-heptyl | n-butyl | phenyl |
| 8F | n-heptyl | n-hexyl | phenyl |
| 8G | ethyl | n-butyl | phenyl |

9. 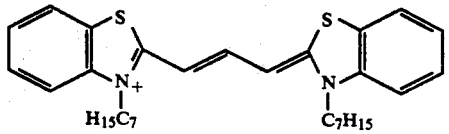 570 nm

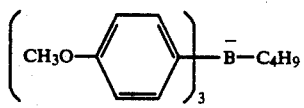

10. 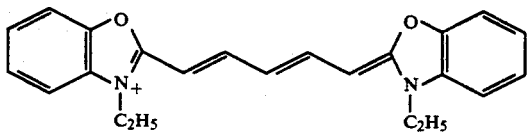 590 nm

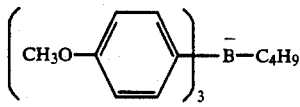

11. 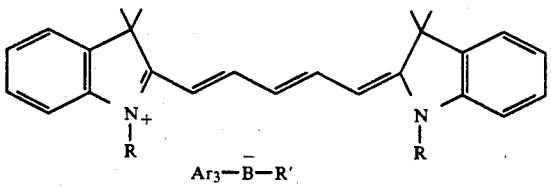 640 nm

| No. | R | R' | Ar |
|---|---|---|---|
| 11A | methyl | n-butyl | phenyl |
| 11B | methyl | n-hexyl | phenyl |
| 11C | n-butyl | n-butyl | phenyl |
| 11D | n-butyl | n-hexyl | phenyl |
| 11E | n-pentyl | n-butyl | phenyl |
| 11F | n-pentyl | n-hexyl | phenyl |
| 11G | n-heptyl | n-butyl | phenyl |
| 11H | n-heptyl | n-hexyl | phenyl |
| 11I | methyl | n-butyl | anisyl |

12. 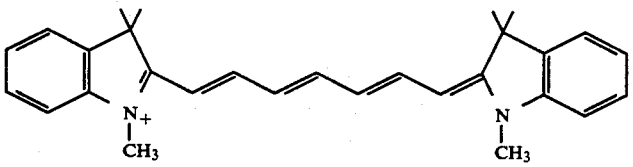 740 nm

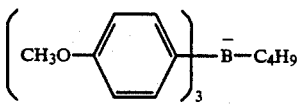

Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The cationic dye-borate anion complex is usually used in an amount up to about 1 percent by weight based on the weight of the photopolymerizable or crosslinkable species in the photohardenable composition. More typically, the cationic dye-borate anion complex is used in an amount of about 0.2 percent to 0.5 percent by weight.

While the cationic dye-borate anion complex can be used alone as the initiator, film speeds tend to be quite low and oxygen inhibition is observed. It has been found that it is preferable to use the complex in combination with an autoxidizer. an autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N, N-dimethylaniline, ethyl 4-(N,N-dimethylamino) benzoate, 3-chloro-N, N-dimethylaniline, 4-chloro-N, N-dimethylaniline, 3-ethyoxy-N, N-dimethylaniline, 4fluoro-N, N-dimethylaniline, 4-methyl-N,N-dimethylaniline, 4-ethyoxy-N,N-dimethylaniline, N,N-dimethylthioanicidine, 4-amino- N,N-dimethylaniline, 3-hydroxy-N,N-dimethylaniline, N,N,N',N'-tetramethyl-1,4-dianiline, 4-acetamido-N, N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA) and p-t-butl-N,N-dimethylaniline.

The autoxidizers are preferably used in the present invention in concentrations of about 4–5 percent by weight.

The photohardenable compositions of the present invention can be coated upon a support in a conventional manner and used as a photoresist element on the specific dye patches on the donor sheet.

Anionic dye compounds are also useful in the present invention. Anionic dye-iodonium ion compounds of the formula (IV):

where $D-$ is an anionic dye and $R^5$ and $R^6$ are independently selected from the group consisting of aromatic nuclei such as phenyl or naphthyl and n is 1 or 2; and anionic dye-pyryllium compounds of the formula (V):

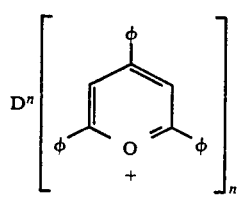

where $D-$ and n are as defined above are typical examples of anionic dye complexes.

Representative examples of anionic dyes include xanthene and oxonol dyes. For example Rose Bengal, cosine, erythiosin, and fluorscein dyes are useful. In addition to iodonium and pyryllium ions, other compounds of anionic dyes and sulfonium and phosphonium cations are potentially useful.

As in the case of the cationic dye compounds, useful dye-cation combinations can be identified through the Weller equation as having a negative free energy.

Selected examples of anionic dye compounds are shown in Table IIλ max. ca. 570 nm in TMPTA). In Table II the symbol $\phi$ is used for a phenyl group and the structure.

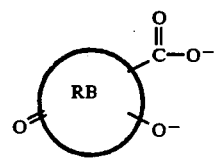

is used for

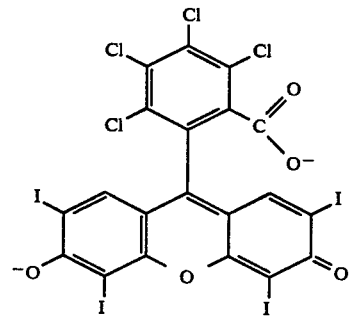

For optimum performance, the blue sensitive layer is sensitive at about 450 nm, the green sensitive layer is sensitive at about 500 nm, and the red sensitive layer is sensitive at 650 nm. They are also useful in electronic imaging using lasers or pencil light sources of appropriate wavelengths.

Because the ionic dye compounds absorb at wavelengths greater than 400 nm, they are colored. Typically, the unexposed dye compound is present with the image-forming agent in the image areas and, thus, the color of the compound must be considered in determining the color of the image. However, the compound is used in very small amounts compared to the image-forming agent and exposure sometimes bleaches the compound.

Various coumarin compounds can also be utilized for producing blue sensitive photoresist elements.

TABLE II

| Anionic Dye-Iodonium Complexes |
|---|

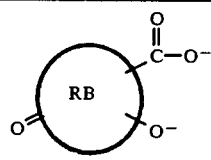     $(\phi_2 I^+)_2$

TABLE II-continued

Anionic Dye-Iodonium Complexes

[structures of anionic dye-iodonium complexes]

The typical coating solution composition of a blue light (420 nm) sensitive photo-crosslinking element is:

| | |
|---|---|
| TMPTA | 35 g |
| DPHPA | 15 g |
| 3-Thenoyl-7-diethylamino coumarin | 15 g |
| 2-Mercaptobenzoxazole (MBO) | 2 g |
| 2.6-Diisopropylaniline | 1 g |
| N-100 (Desmodur Polyisocyanate Resin) | 3.33 g |

The typical coating solution composition of a green light (550 nm) sensitive photo-crosslinking element is:

| | |
|---|---|
| TMPTA | 50 g |
| Compound 8A | 0.2 g |
| 2,6-Diisopropylaniline | 2.0 g |

The typical coating solution composition of a red light (650 nm) sensitive photo-crosslinking element is:

| | |
|---|---|
| TMPTA | 50 g |
| Compound 11 H | 0.31 g |
| 2,6-diisopropylaniline | 2.0 g |

These photosensitive elements may be coated at a solid laydown of 0.1 to 5 g/m$^2$ from a toluene, methanol and cyclopentanone solvent mixture.

In an alternate embodiment the thermally diffusible dye patches can be replaced by thermally diffusible patches cyan, magenta- and yellow-dye forming compounds.

The dye-forming compound, in this embodiment, diffuses in the receiver sheet meet with specific dye-developing agent or agents to produce dye in the receiver sheet.

One example of a useful color former in the invention is a colorless electron donating compound. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spriopyran compounds and the like.

Cyan, magenta and yellow color precursors useful in the present invention can be selected from commercially available materials. Reakt Yellow (186) (a product of BASF), Copikem XI and Copikem XIV (products of Hilton-Davis Chemical Co.) are useful yellow color formers; Cyan S-29663 (an experimental compound from Hilton Davis), Copikem X (a product of Hilton-David) and color formers described in U.S. Pat. No. 4,322,352 are useful cyan color formers and Copikem XX (a product of Hilton Davis) and Pergascript Red (Ciba-Geigy) are useful as magenta color formers. Other examples of useful color formers are shown below:

Yellow color precursors:

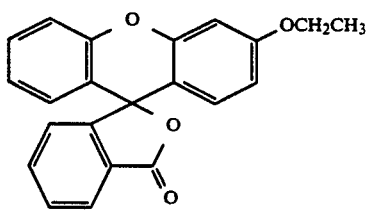
(YP-1)

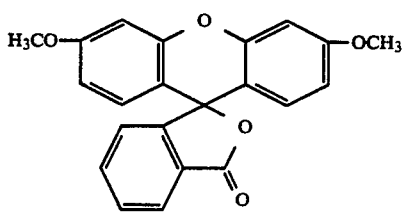
(YP-2)

Cyan color precursors:

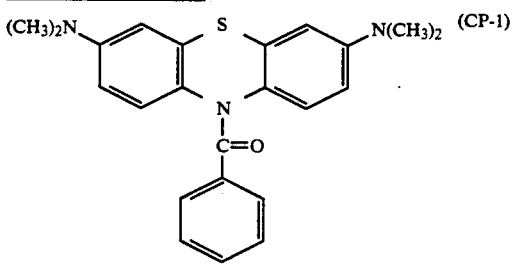
(CP-1)

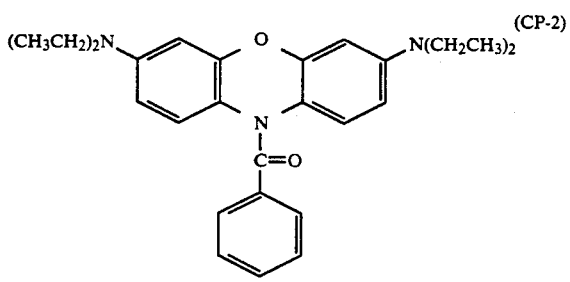
(CP-2)

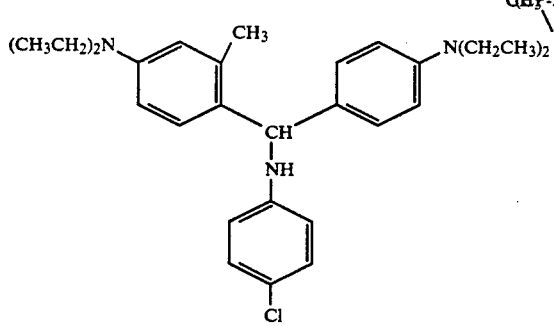
(CP-3)

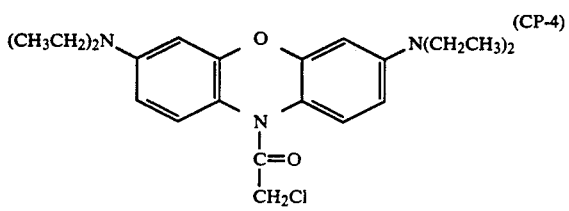
(CP-4)

Magenta color precursors:

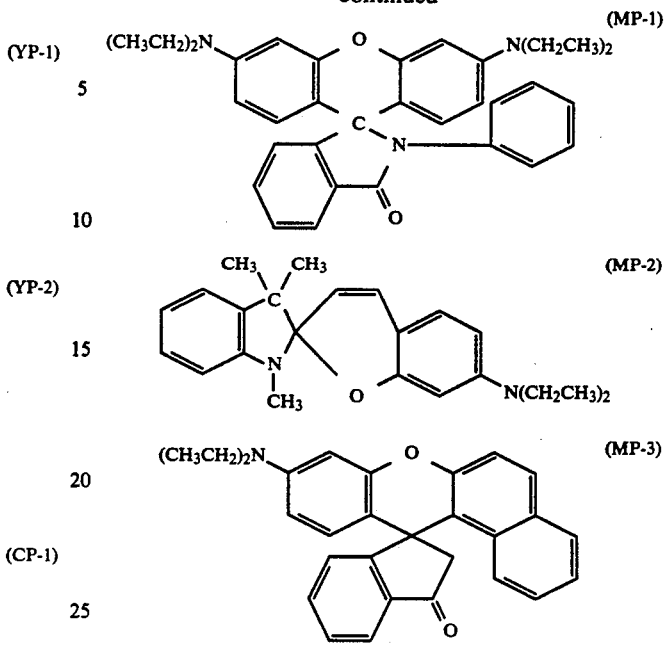

In accordance with one embodiment of the present invention, the radiation sensitive composition may additionally include a polythiol to increase the film speed of the light sensitive layers.

Useful polythiols include ethylene glycol bis(thioglycolate), ethylene gylcol bis($\beta$-mercaptopropionate), trimethylolpropane tris(thioglycolate), pentaerythritol tetrakis(thioglycolate) and the most preferred pentaerythritol tetrakis($\beta$-mercaptopropionate) and trimethylolpropane tris($\beta$-mercaptopropionate), and mixtures thereof. These compounds are commercially available. Certain polymeric polythiols such as polypropylene ether glycol bis($\beta$-mercaptopropionate) which is prepared by esterification of polypropylene ether glycol may also be useful.

Various oligomers or polymers can also be used in the present invention to improve the film speed of the photosensitive layers. These materials must be soluble in the photosensitive composition and not interfere with the photopolymerization reaction. Reactive oligomers contain terminal or pendant ethylenic unsaturation and include urethane, ester and epoxy based reactive acrylate, methacrylate, vinyl and allyl prepolymers. Useful non-reactive oligomers or polymers are solid or viscous liquids at room temperature but soluble in the unreacted photosensitive composition. Representative examples of some commercially available oligomers or polymers which are useful in the present invention include reactive materials such as diallyl o-phthalate prepolymer (Polysciences), UVithane 893 (Morton Thiokol, Inc.), Ebercryl 270 (Virginia Chemicals) and non-reactive materials such as ethyl cellulose, or Lucite.

Where the photoresist layer is positive-acting, it is generally desirable to etch away irradiated portions of the photoresist layer. Although the rate of permeability is often modified, the rate is not so greatly differentiated between exposed and unexposed areas as to provide excellent images. Only moderate quality images can be obtained without etching in such systems.

The heating is done approximately uniformly during the dye-transfer operation. By "uniformly" it is meant only that there is not such a difference in the variation of heat applied at one area versus another that it is the amount of heat which determines whether or not dye is transferred. This distinguishes from procedures used in laser heated dye sublimation processes.

The support for the dye-receiving element employed in the invention may be a transparent film when transparencies are desired to be obtained such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, white polyester (polyester with white pigment incorporated therein), an ivory paper, a condenser paper or a synthetic paper such as duPont Tyvek ®. In a preferred embodiment, poly(ethylene terephthalate) is employed.

In the embodiment of this invention where dye-precursors rather than dyes are used, it is necessary to incorporate the dye-developers in the receiver element, where the colored dye image is formed.

Illustrative examples of color developers useful with the electron donating type color precursors are clay minerals such as acid clay, active clay, attapulgite, etc.; organic acids such as tannic acid, Gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3-cyclohexyl-5-($\alpha,\alpha$-dimethylbenzyl)salicylate (see U.S. Pat. Nos. 3,864,146 and 3,934,070), oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

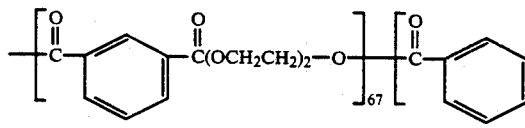

The dye image-receiving layer of the dye-receiver employed in the invention may comprise, for example, a polycarbonate, a polyurethane, a polyester, polyvinyl chloride, poly(styrene-co-acrylonitrile), poly(caprolactone) or mixtures thereof. The dye image-receiving layer may be present in any amount which is effective for the intended purpose. In general, good results have been obtained at a concentration of from about 1 to about 5 g/m$^2$.

In a preferred embodiment of the invention, the dye image-receiving layer is a polycarbonate. The term "polycarbonate" as used herein means a polyester of carbonic acid and glycol or a divalent phenol. Examples of such glycols or divalent phenols are p-xylylene glycol, 2,2-bis(4-oxyphenyl)propane, bis(4-oxyphenyl)methane, 1,1-bis(4-oxyphenuyl)ethane, 1,1-bis(oxyphenyl)butane, 1,1-bis(oxyphenyl)cyclohexane, 2,2-bis(oxyphenyl)butane, etc.

In another preferred embodiment of the invention, the polycarbonate dye image-receiving layer is a bisphenol-A polycarbonate having a number average molecular weight of at least about 25,000. In still another preferred embodiment of the invention, the bisphenol-A polycarbonate comprises recurring units having the formula:

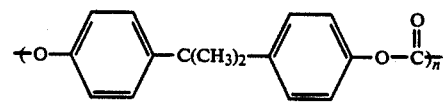

wherein n is from about 100 to about 500.

Examples of such polycarbonates include General Electric Lexan ®, Polycarbonate Resin #ML-4735 (Number average molecular weight app. 36,000), and Bayer AG Makrolon #5705 ® (Number average molecular weight app. 58,000). The later material has a T$_g$ of 150° C. Other specific compositions of the dye receiving layer are given in U.S. Pat. No. 4,927,803 and U.S. Pat. No. 4,775,657.

EXAMPLES

The following examples are intended to be illustrative of the invention and not exhaustive in describing all its forms. Parts and percentages are by weight unless otherwise indicated.

EXAMPLE 1: FULL-COLOR IMAGING BY DIFFUSION OF DYES

Dye receivers are prepared by coating the following layers in the order recited on a 100 um thick transparent poly(ethylene terephthalate) film support:

(a) Subbing layer of poly(acrylonitrile-co-vinylidene chloride-co-acrylic acid) (14:80:6 wt ratio) (0.059 g/m$^2$) coated from 2-butanone;

(b) Polymeric intermediate layer of poly(butylacrylate-co-acrylic acid) (50:50 et. ratio) (8.1 g/m$^2$;

(c) Polymeric intermediate layer of FC-430 ® surfactant (3M Company) (0.0046 g/m$^2$) and the following partially sulfonated glycol-phthalate (0.44 g/m$^2$):

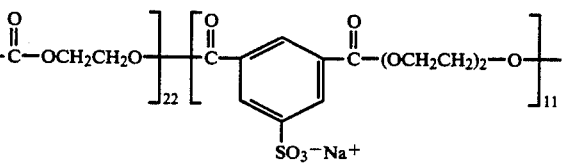

(d) Dye-receiving layer of Makrolon 5705 ® polycarbonate (Bayer AG) (2.9 g/m$^2$), 1,4-didecoxy-2,5-dimethoxybenzene (0.38 g/m$^2$), Tone-300 ® polycaptolactone (Union Carbide Corp.) (0.38 g/m$^2$), and FC-431 ® surfactant (3M Corp.) (0.01 g/m$^2$) coated from a dichloromethane and trichloroethylene solvent mixture; and (e) Overcoat layer of Tone-300 ® polycaptolactone (Union Carbide Corp.) (0.11 g/m$^2$) and 3M Corp. FC-431 ® surfactant (0.005 g/m$^2$) coated from a dichloromethane and trichloroethylene solvent mixture.

A cyan, magenta and yellow dye-donor element with layers of a red, a green and a blue sensitive resist layer respectively coated on the dye layers is prepared as follows one side of a 6 um poly(ethylene terephthalate) support, a subbing layer of titanium n-butoxide (duPont Tyzor TBT ® (0.081 g/m$^2$) is Gravure-printed from a n-propyl acetate and 1-butanol solvent mixture. On top of this layer are Gravure-printed repeating color patches of cyan, magenta and yellow dyes. The cyan coating contain the cyan dye illustrated above (0.28 g/m²) and cellulose acetate propionate (2.5% acetyl, 45% propionyl) binder (0.44 g/m²) from a toluene, methanol and cyclopentanone solvent mixture. The magenta coating contain the magenta dye illustrated above (0.15 g/m²) in the same binder as the cyan dye (0.32 g/m²). The yellow coating contain the yellow dye illustrated above (0.14 g/m²) in the same binder as the cyan dye (0.25 g/m²).

On the reverse side of the dye-donor is coated a subbing layer of Bostik 7650® polyester (Emhart Corp.) (43 mg/m²) coated from a toluene and 3-pentanone solvent mixture and a slipping layer of PS-513® amino-terminated silicone (Polymer Sciences) (0.013 g/m²) and p-toluenesulfonic acid (0.043 g/m²) in a cellulose acetate propionate (2.5% acetyl, 45% propionyl) binder (0.40 g/m²) from a toluene, methanol and 3-pentanone solvent mixture.

The blue sensitive (420 nm) layer is coated on the yellow dye layer of the donor sheet with the following ratio of weights of the solid components from a toluene, methanol and cyclopentanone solvent mixture at a 0.35 g/m² coverage of TMPTA

| | |
|---|---|
| TMPTA | 35 g |
| DPHPA | 15 g |
| 3-thenoyl-7-diethylamino coumarin | 15 g |
| 2-mercaptobenzoxazole (MBO) | 2.0 g |
| 2,6-diisopropylaniline | 1.0 g |
| N-100 (Desmodur Polyisocyanate Resin) | 3.33 g |

The green sensitive (550 nm) layer is coated on the magenta dye layer of the donor sheet with the following ratio of weights of the solid components from a toluene, methanol and cyclopentanone solvent mixture at a 0.5 g/m² coverage of TMPTA.

| | |
|---|---|
| TMPTA | 50 g |
| Complex 8A | 0.2 g |
| 2,6-diisopropylaniline | 2.0 g |

The red sensitive (650 nm) layer is coated on the cyan dye layer of the donor sheet with the following ratio of weights of the solid components from a toluene, methanol and cyclopentanone solvent mixture at 0.5 g/m² coverage of TMPTA.

| | |
|---|---|
| TMPTA | 50 g |
| Complex 11 H | 0.31 g |
| 2,6-diisopropylaniline | 2.0 g |

The patches of the dye donor sheet is then exposed with white light (filtered to certain radiation of wavelengths between 400 nm and 700 nm) using a transparency with a cyan, a magenta and a yellow stop wedge pattern each for 20 seconds for the red, green and blue sensitive patches, respectively. Each layer is then sequentially laminated in the dark to the dye-receiver layer in registry and passed through a hot pinch roller each time (1 minute) with each color exposed donor sheet. A full color positive image is obtained in the receiver sheet after all three color dye layers are transferred. This constitutes a constructive reduction to practice of the invention for thermal diffusion of dyes.

EXAMPLE 2: FULL-COLOR IMAGING BY DIFFUSION OF DYE-PRECURSORS

When dye precursors are used, the receiver sheet must contain the dye developer to form dye after thermal transfer of the dye-precursor. The developing dye receiving layer for this example is prepared as follows:

A mixture of 852 g water, 250 g 25% Tamol 731 (Rohm & Haas Chemical Co.), 75 g HT clay, 1000 g KC-1 (a synthetic developer manufactured by Fuji Photo Film Company, Ltd.,), 15 g Calgon T (Calgon, Inc.) 30 g Dequst 2006 (Monsanto Co.) is ground to a particle size less than 5 microns. To this mixture is added 25 parts HT clay and 10 parts Dow 501 latex per 65 parts of the mixture. The resultant material is coated with a #10 Meyer bar on 80 lb Black and White Enamel base stock at 30 to 35% solids.

The photosensitive dye-precursor donor sheet is prepared exactly in the same manner as in Example 1 except (1) a yellow dye is replaced by the same weight of yellow dye precursors (YP-1);

(2) the cyan dye is replaced by the same weight of the cyan dye precursor (CP-1); and (3) the magenta dye is replaced by the same weight of the magenta dye precursor (MP-1).

The above donor and receiver sheets are utilized to prepare a full color image exactly in the same manner as described in Example 1. A full color image is thus obtained. This constitutes constructive reduction to practice of the invention using thermal diffusion of dye-precursors.

The invention has been described with reference to preferred embodiments. However, it is to be understood that other variations and embodiments of the invention may be performed. The invention is only intended to be limited by the breadth of the claims attached hereto.

I claim:

1. A method of making a full color copy of an original which comprises providing a first, second and third imaging element, on a support, the first imaging element comprising a first primary color light sensitive layer of a photoresist material over a first color dye donor layer containing a first color dye or dye precursor complementary to the first primary color, the second imaging element comprising a second primary color light sensitive layer of a photoresist material over a second color dye donor layer containing a second color dye or dye precursor complementary to the second primary color and the third imaging element comprising a third primary color light sensitive layer of a photoresist material over a third color dye donor layer containing a third color dye or dye precursor complementary to the third primary color, all of the dye donor layers being intermediate the light sensitive layers and the support, exposing said first imaging element to light of the first primary color to alter the permeability of the first primary color light sensitive layer to the first color dye or dye precursor in the areas upon which the light of said first primary color impinges, contacting said first imaging element with the receiver sheet and thermally transferring a first color dye image onto the receiver sheet, exposing the second imaging element to light of the second primary color to alter the permeability of the second primary color light sensitive layer to the second color dye or dye precursor in the areas upon which the light of the second primary color impinges, contacting said second imaging element with the receiver sheet and thermally transferring a second color dye image onto the receiver sheet in registry with the first color dye image, exposing the third imaging element to light of the third primary color to alter the permeability of the third light sensitive layer to the third color dye or dye precursor in the areas upon which the light of the third primary color impinges, contacting said third imaging element with the receiver sheet and thermally transferring a third color dye image onto the receiver sheet in registry with said first and second color images.

2. The method of claim 1 wherein each primary color light sensitive layer is a negative working photoresist material.

3. The method of claim 1 wherein after the third color dye image thermal transfer, the receiver sheet is separated from the donor sheet.

4. A method of making a full color copy of an original color transparency which comprises providing a first, second and third imaging element on a support, the first imaging element comprising a first primary color light sensitive layer of a photoresist material over a first color dye donor layer containing a first color dye or dye precursor complementary to the first primary color, the second imaging element comprising a second primary color light sensitive layer of a photoresist material over a second color dye donor layer containing a second color dye or dye precursor complementary to the second primary color and the third imaging element comprising a third primary color light sensitive layer of a photoresist material over a third color dye donor layer containing a third color dye or dye precursor complementary to the third primary color, all of the dye donor layers being intermediate the light sensitive layers and the support, exposing said first imaging element to light through said color transparency to alter the permeability of the first primary color light sensitive layer to the first color dye or dye precursor in the areas upon which the first primary color light impinges, contacting said first imaging element with a receiver sheet and thermally transferring a first color dye image onto the receiver sheet, exposing said second imaging element to light through said color transparency to alter the permeability of the second primary color light sensitive layer to the second color dye or dye precursor in the areas upon which the second primary color light impinges, contacting said second imaging element with the receiver sheet and thermally transferring a second color dye image onto the receiver sheet in registry with the first color dye image, exposing the third imaging element to light through said color transparency to alter the permeability of the third light sensitive layer to the third color dye or dye precursor in the areas upon which the third primary color light impinges, contacting said third imaging element with the receiver sheet and thermally transferring a third color dye image onto the receiver sheet in registry with said first and second color dye images.

5. The method of claim 4 wherein each exposing step is with a light of a wave length corresponding to that of the primary color light sensitive layer of imaging element.

6. The method of claim 4 wherein each exposing step is with a white light.

7. The method of claim 6 wherein the white light is passed through a color correction filter.

8. The method of claim 4 wherein each primary light sensitive layer is a negative working photoresist material.

9. A multi-colored light sensitive dye donor element comprising a support having on one surface at least one discrete area of a first light sensitive imaging element, at least one discrete area of a second light sensitive imaging element and at least one discrete area of a third light sensitive imaging element, said first light sensitive imaging element comprising a first primary color light sensitive discrete area of a intermediate said first primary color light sensitive discrete area and said support is disposed a first colored thermally transferable dye donor discrete area containing a first color dye or dye precursor complementary to said first primary color, in registry with said first primary color light sensitive discrete areas, said second light sensitive imaging element comprising a second primary color light sensitive discrete area of a photoresist material and intermediate said second primary color light sensitive discrete area and said support is disposed, a second colored thermally transferable dye donor discrete area containing a second color dye or dye precursor complementary to said second primary color in registry with said second light sensitive discrete area, said third light sensitive imaging element comprising a third primary color light sensitive discrete area of a photoresist material and intermediate said third primary color light sensitive discrete area and said support is disposed, a third colored thermally transferable dye donor discrete area containing a third color dye or dye precursor complementary to said third primary color in registry with said third primary color light sensitive discrete area the first, second and third primary color light sensitive discrete areas each being capable of altering permeability to the dye or dye precursor of the corresponding colored dye donor area.

10. The multi-colored light sensitive dye donor element of claim 9 wherein said first primary color light sensitive discrete area is sensitive to red light and said second primary color light sensitive discrete area is sensitive to green light and said third primary color light sensitive discrete area is sensitive to blue light.

* * * * *